(12) United States Patent  
Lai (10) Patent No.: US 7,115,906 B2
(45) Date of Patent: Oct. 3, 2006

(54) THIN FILM TRANSISTOR ARRAY AND FABRICATING METHOD THEREOF

(75) Inventor: Han-Chung Lai, Taoyuan Hsien (TW)

(73) Assignee: Au Optronics Corporation, Hsinchu (TW)

( * ) Notice: Subject to any disclaimer, the term of this patent is extended or adjusted under 35 U.S.C. 154(b) by 33 days.

(21) Appl. No.: 10/710,597

(22) Filed: Jul. 23, 2004

(65) Prior Publication Data

US 2005/0242347 A1 Nov. 3, 2005

(30) Foreign Application Priority Data

Apr. 29, 2004 (TW) ................................ 93111981 A (51) Int. Cl.
*H01L 29/04* (2006.01)
*H01L 29/15* (2006.01)
*H01L 31/036* (2006.01)
*H01L 29/10* (2006.01)
*H01L 31/112* (2006.01)

(52) U.S. Cl. ............................. 257/72; 257/57; 257/59; 257/66; 257/88; 257/291; 257/E27.1; 257/E27.114; 257/E27.116; 257/E27.151; 257/E29.117; 257/E29.147

(58) Field of Classification Search .................. 257/57, 257/59, 66, 88, 72, 291, E27.1, E27.114, 257/E27.116, E27.151, E29.117, E29.147
See application file for complete search history.

(56) References Cited

U.S. PATENT DOCUMENTS 5,041,888 A * 8/1991 Possin et al. .................. 257/59
5,173,792 A * 12/1992 Matsueda ..................... 349/54
5,828,082 A * 10/1998 Wu .............................. 257/57
5,959,312 A * 9/1999 Tsai et al. ..................... 257/57
6,262,784 B1 * 7/2001 Kim ............................. 349/43
6,362,028 B1 * 3/2002 Chen et al. .................. 438/149
6,714,269 B1 * 3/2004 Huang ......................... 349/54
6,989,299 B1 * 1/2006 Dai et al. .................... 438/164
2001/0031510 A1 * 10/2001 Ahn et al. ..................... 438/48
2002/0151174 A1 * 10/2002 Jeong et al. ................. 438/686
2002/0158573 A1 * 10/2002 Kobashi ...................... 313/498
2002/0171108 A1 * 11/2002 Lim et al. .................... 257/347
2002/0190253 A1 * 12/2002 Tsujimura et al. ............. 257/59
2004/0140469 A1 * 7/2004 Liao et al. ..................... 257/72
2004/0250878 A1 * 12/2004 Watanabe et al. ........... 141/200

* cited by examiner

*Primary Examiner*—Ida M. Soward
(74) *Attorney, Agent, or Firm*—Jiang Chyun IP Office (57) ABSTRACT

A thin film transistor array including a substrate, a plurality of scan lines, a plurality of data lines, a plurality of thin film transistors, an etch barrier layer and a plurality of pixel electrodes is provided. The scan lines and the data lines are disposed over the substrate to define a plurality of pixel areas. Each thin film transistor is disposed in one of the pixel areas and driven by the corresponding scan line and data line. The etch barrier layer including a plurality openings is disposed over the scan line or a common line. Each pixel electrode electrically connected to the corresponding thin film transistor is disposed in one of the pixel areas, wherein a portion of each pixel electrode is coupled to the corresponding scan line through one of the openings to form a storage capacitor. Furthermore, a fabricating method of the thin film array is also provided.

16 Claims, 8 Drawing Sheets

THIN FILM TRANSISTOR ARRAY AND FABRICATING METHOD THEREOF

CROSS REFERENCE TO RELATED APPLICATIONS

This application claims the priority benefit of Taiwan application serial no. 93111981, filed Apr. 29, 2004.

BACKGROUND OF INVENTION

1. Field of Invention

The present invention relates to a thin film transistor array (TFT array) and a fabricating method thereof. More particularly, the present invention relates to a thin film transistor array (TFT array) having an enhanced storage capacitor and a fabricating method thereof.

2. Description of Related Art

The proliferation of multi-media systems in our society depends to a large extent on the progressive development of semiconductor devices and display devices. Display devices such as the cathode ray tube (CRT) have been used for quite some time due to its remarkable display quality, reliability and low cost. Although the conventional CRT has many advantages, but the design problem of the electron gun renders is heavy, bulky and energy wasting. Moreover, there is always some potential danger of hurting viewer's eyes due to its emission of some radiation. With big leaps in the techniques of manufacturing semiconductor devices and optic-electronics devices, high picture quality, slim, low power consumption and radiation-free displays such as the thin film transistor liquid crystal displays (TFT-LCD) have gradually become mainstream display products.

Generally, a color TFT-LCD includes a color filter (C/F), a TFT array and a liquid crystal layer disposed therebetween. The TFT array includes a plurality of thin film transistors, which is arranged in an area array and is driven by a plurality of scan lines and data lines. Each thin film transistor is disposed in a pixel area and is electrically connected to a corresponding pixel electrode formed by indium tin oxide (ITO), indium zinc oxide (IZO) or other transparent conductive materials. Each thin film transistor is used to drive the liquid crystal layer to show various gray levels. Furthermore, in a pixel of the conventional TFT array, a storage capacitor may be formed by a pixel electrode, the corresponding scan line and a dielectric layer (e.g. a gate insulator and/or a passivation layer) therebetween. Also, the storage capacitor can be formed by a pixel electrode, a common line and a dielectric layer therebetween to provide better picture quality. In the prior art, storage capacitor is classified into Metal-Insulator-Metal (MIM) type and Metal-Insulator-ITO (MII) type, which are described as follow.

Figure 1:
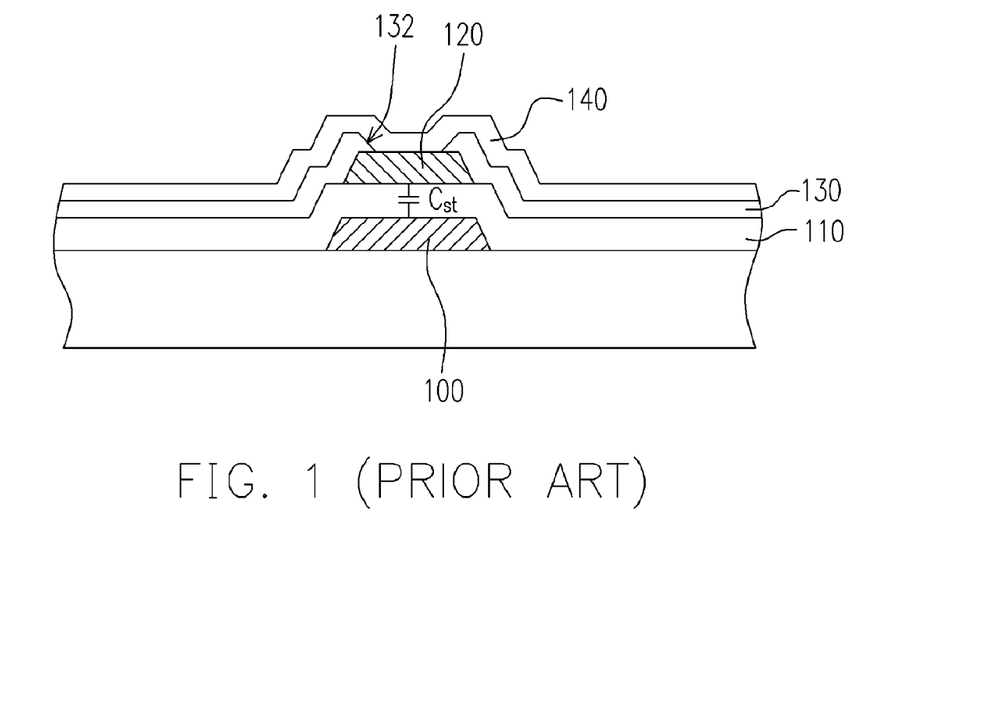
FIG. 1 is a cross-sectional view of a conventional MIM type storage capacitor.

FIG. 1 is a cross-sectional view of a conventional MIM type storage capacitor. Referring to FIG. 1, in a conventional pixel structure, a MIM type storage capacitor is coupled by a scan line (not shown) and an upper electrode 120 or is coupled by a common line 100 and an upper electrode 120. It should be noted that the common line 100 (or the scan line) and the upper electrode is electrical isolated by a gate insulator 110 therebetween in the MIM type storage capacitor. Therefore, capacitance of the MIM type storage capacitor relates to thickness of the gate insulator 110. In other words, the smaller the thickness of the gate insulator 110, the larger the capacitance Cst of the MIM type storage capacitor is. Furthermore, a pixel electrode 140 is electrically connected to the upper electrode 120 through a contact via 132 formed in a passivation layer 130.

Figure 2:
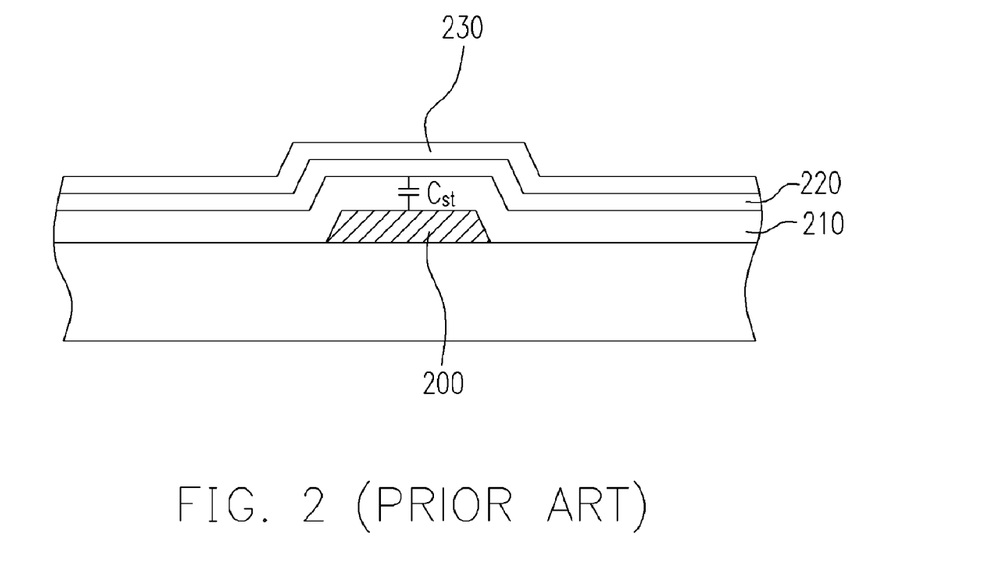
FIG. 2 is a cross-sectional view of conventional MII type storage capacitor.

FIG. 2 is a cross-sectional view of a conventional MII type storage capacitor. Referring to FIG. 2, in a conventional pixel structure, a MII type storage capacitor is coupled by a scan line (not shown) and a pixel electrode 230 or is coupled by a common line 200 and a pixel electrode 230. Compared with the MIM type storage capacitor, the common line 200 (or the scan line) and the pixel electrode 230 is electrical isolated by a gate insulator 210 and a passivation layer 220 therebetween in the MII type storage capacitor. Therefore, capacitance of the MII type storage capacitor relates to total thickness of the gate insulator 210 and the passivation layer 220. In other words, the smaller the total thickness of the gate insulator 210 and the passivation layer 220, the larger the capacitance Cst of the MIM type storage capacitor is.

In the conventional TFT array mentioned above, the thickness of the gate insulator 210 and/or passivation layer 220 must be reduced to obtain a larger capacitance Cst without lowering aperture ratio. However, the reliability of thin film transistors may be affected when the thickness of the gate insulator 210 and/or passivation layer 220 is reduced.

SUMMARY OF INVENTION

The invention provides a thin film transistor array to increase the capacitance of the storage capacitor of each pixel.

The invention provides a fabricating method of a thin film transistor array, which is compatible with current processes, to increase the capacitance of the storage capacitor of each pixel.

According to an embodied of the present invention, the thin film transistor array including a substrate, a plurality of scan lines, a plurality of data lines, a plurality of thin film transistor, an etching stop layer and a plurality of pixel electrodes is provided. The scan lines and the data lines are disposed over the substrate and the substrate is defined into a plurality of pixel areas by the scan lines and the data lines. Each thin film transistor is disposed in one of the pixel areas and is driven by the scan lines and the data lines correspondingly. The etching stop layer is disposed over the scan lines, and the etching stop layer has a plurality of openings. Each pixel electrode is disposed in one of the pixel areas and is electrically connected to one of the thin film transistors correspondingly, wherein a portion of each pixel electrode is coupled to one of the scan lines through one of the openings to form a storage capacitor.

According to an embodied of the present invention, the thin film transistor array including a substrate, a plurality of scan lines, a plurality of data lines, a plurality of thin film transistor, a plurality of common lines, an etching stop layer and a plurality of pixel electrodes is provided. The scan lines and the data lines are disposed over the substrate and the substrate is defined into a plurality of pixel areas by the scan lines and the data lines. Each thin film transistor is disposed in one of the pixel areas and is driven by the scan lines and the data lines correspondingly. The common lines are disposed over the substrate, wherein each common line is located between two adjacent scan lines. The etching stop layer is disposed over the common lines, wherein the etching stop layer has a plurality of openings. Each pixel electrode is disposed in one of the pixel areas and is electrically connected to one of the thin film transistors correspondingly, wherein a portion of each pixel electrode is coupled to one of the scan lines through one of the openings to form a storage capacitor.

In an embodiment of the present invention, the thin film transistor array further including a gate insulator disposed between the etching stop layer and the scan lines (or the common lines). Furthermore, the gate insulator has a plurality of recesses, and each recess is located under one of the openings of the etching stop layer.

In an embodiment of the present invention, the thin film transistor array further including a semiconductor layer disposed between the etching stop layer and the gate insulator. Moreover, the thin film transistor array further including a passivation layer disposed over the etching stop layer and the gate insulator, wherein the openings of the etching stop layer is exposed by the passivation.

In an embodiment of the present invention, the etching stop layer includes a plurality of stripe patterns; each stripe pattern is located above one of the scan lines (or common lines) correspondingly. Furthermore, the etching stop layer includes a plurality of frame patterns; each frame pattern is located under one of the pixel electrodes correspondingly.

In an embodiment of the present invention, a material of the pixel electrodes comprises ITO, IZO or other transparent conductive material.

According to an embodied of the present invention, the fabricating method of a thin film transistor array is provided. First, a first patterned conductive layer is formed over the substrate, and then a gate insulator and a semiconductor material layer is formed over the substrate and the first patterned conductive layer sequentially. Thereafter, an etching stop layer located above the first patterned conductive layer is formed over a portion of the semiconductor material layer. Next, a second conductive material layer is formed over the semiconductor material layer and the etching stop layer. Afterward, the second conductive material layer and the semiconductor material layer are patterned to simultaneously form a second patterned conductive layer and a plurality of semiconductor layers, which are located under the etching stop layer and the second patterned conductive layer. Then, a passivation layer is formed over the substrate, and a portion of the passivation layer, which is located on the second patterned conductive layer, is removed to form a plurality of contact windows. At the same time, a portion of the passivation layer, the etching stop layer and the semiconductor layers, which are located above the first patterned conductive layer, are removed simultaneously. Ultimately, a plurality of pixel electrodes is formed over the substrate. Wherein each pixel electrode is electrically connected to the second patterned conductive layer through one of the contact windows, and a portion of each pixel electrode is coupled to the first patterned conductive layer through one of the openings to form a storage capacitor.

In an embodiment of the present invention, the fabricating method further includes forming an ohmic contact layer over the semiconductor material layer and the etching stop layer before forming the second conductive material layer over the semiconductor material layer and the etching stop layer.

In an embodiment of the present invention, the first patterned conductive layer is formed by forming a first conductive material layer over the substrate, and then the first conductive material layer is patterned to form a plurality of scan lines and a plurality of gates connected with the scan lines. Furthermore, the etching stop layer is formed above the gates and the scan lines.

In an embodiment of the present invention, the first patterned conductive layer is formed by forming a first conductive material layer over the substrate. And then the first conductive material layer is patterned to form a plurality of scan lines, a plurality of gates connected with the scan lines and a plurality of common lines located between two adjacent scan lines. Furthermore, the etching stop layer is formed above the gates and the common lines.

In an embodiment of the present invention, the fabricating method further includes removing partial thickness of the etching stop layer by using the second patterned conductive layer as a mask during patterning the second conductive material layer and the semiconductor material layer.

In an embodiment of the present invention, the fabricating method further includes removing partial thickness of the gate insulator to form a plurality of recesses, which are located under the openings, when forming the contact windows.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 3:
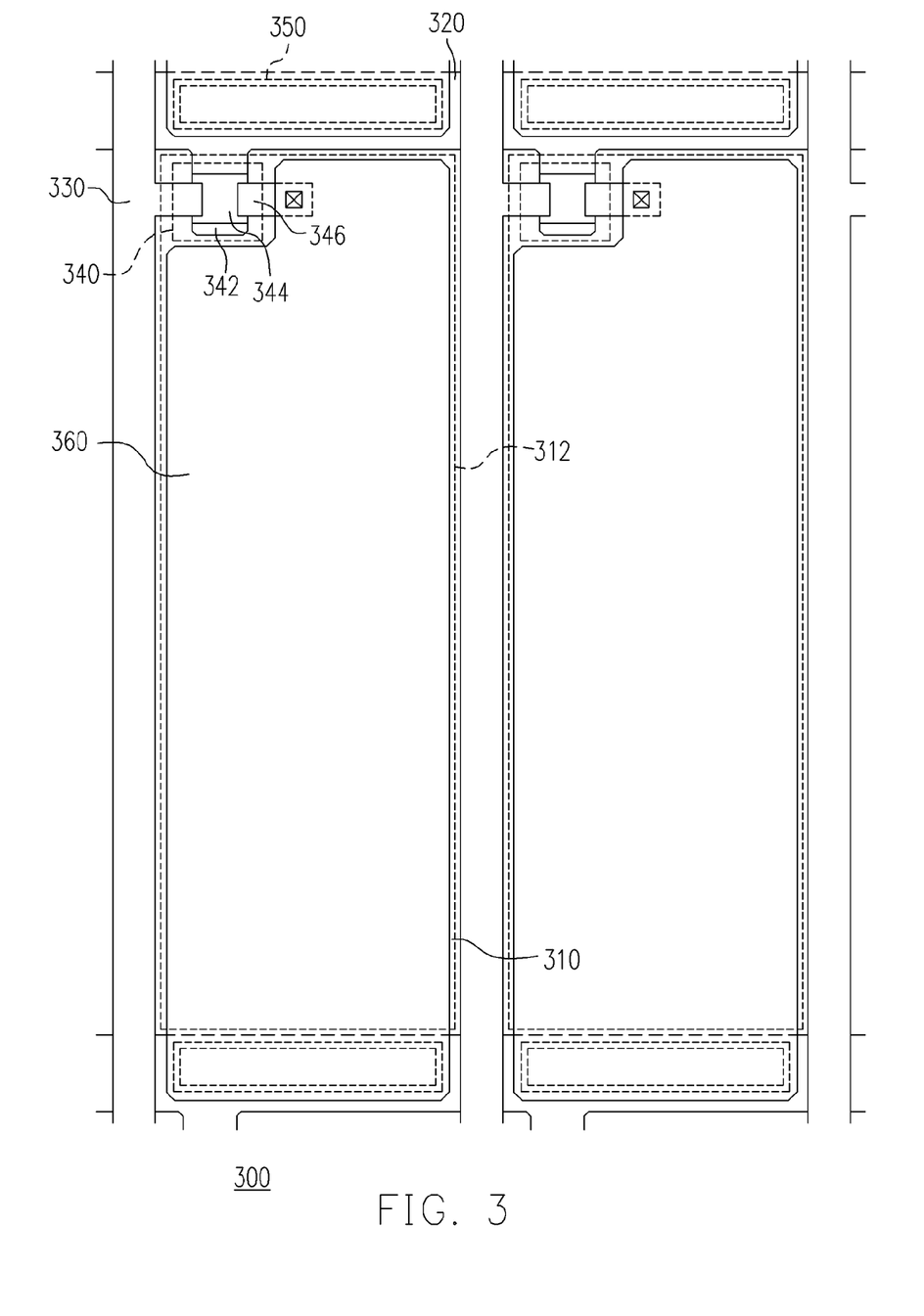
FIG. 3 is a top view of the thin film transistor array according to an embodiment of the present invention.

FIG. 3 is a top view of the thin film transistor array according to an embodiment of the present invention. Referring to FIG. 3, the thin film transistor array 300 of the present invention includes a substrate 310, a plurality of scan lines 320, a plurality of data lines 330, a plurality of thin film transistor 340, an etching stop layer 350 and a plurality of pixel electrodes 360.

In an embodiment of the present invention, the substrate 310 includes a glass substrate, a plastic substrate or substrate made of by other material. As shown in FIG. 3, the scan lines 320 and the data lines 330 are disposed over the substrate 310, which is defined into a plurality of pixel areas 312 by the scan lines 320 and the data lines 330. More specifically, the scan lines 320 are arranged parallel to each other over the substrate 310, and the data lines 330 arranged parallel to each other over the substrate 310, for example. Since the extended direction of the scan lines 320 is perpendicular to the extended direction of the data lines 330, the substrate 310 is defined into rectangular pixel areas 312.

Each thin film transistor 340 is disposed in one of the pixel areas 312 and is driven by the scan lines 320 and the data lines 330 correspondingly. More specifically, the thin film transistor 340 is disposed adjacent to the intersection of the scan line 320 and the data line 330, i.e. the thin film transistor 340 is disposed at a corner of the pixel area 312. In an embodiment of the present invention, the thin film transistor 340 includes a gate 342, a semiconductor layer 344 located above the gate 342, and a source/drain 346, for example. Wherein the gate 342 and the scan line 320 may be formed simultaneously, and the source/drain 346 and the data line 330 may be formed simultaneously.

Figure 4A:
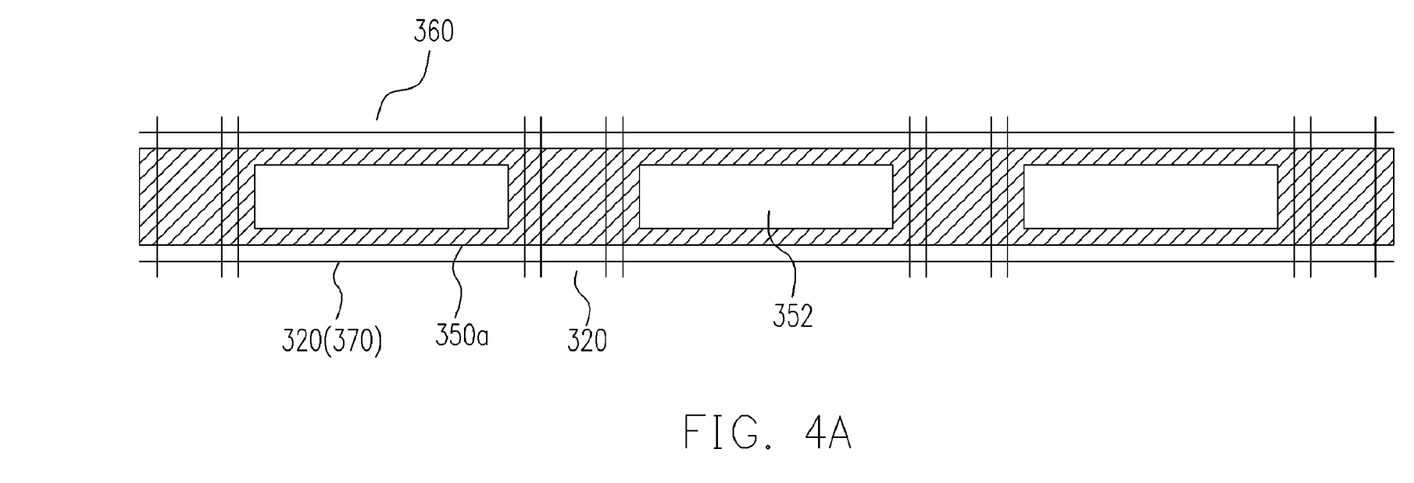
FIG. 4A is a top view of the etching stop layer according to an embodiment of the present invention.
Figure 4B:
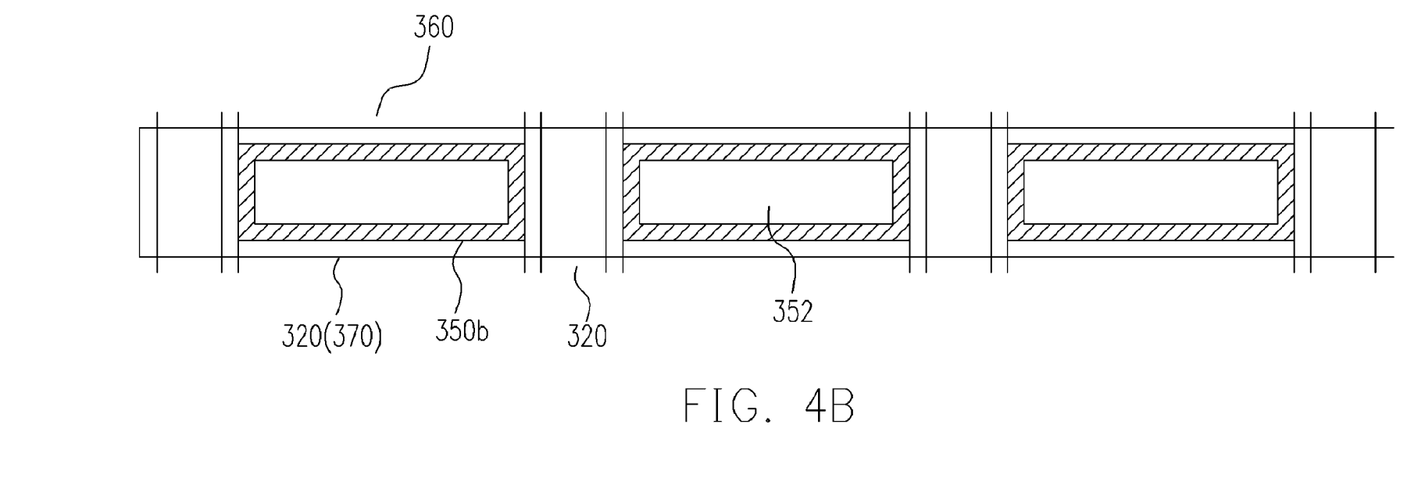
FIG. 4B is a top view of the etching stop layer according to another embodiment of the present invention.

Referring to FIG. 3, the etching stop layer 350 is disposed over the scan lines 320, and the etching stop layer 350 has a plurality of openings 352 (referring to FIG. 4A and 4B). Furthermore, each pixel electrode 360 is disposed in one of the pixel areas 312 and is electrically connected to one of the thin film transistors 340 correspondingly. Wherein a portion of each pixel electrode 360 is coupled to one of the scan lines 320 through one of the openings 352 to form a storage capacitor. The storage capacitor is a MII type storage capacitor and the cross-sectional view thereof is shown in FIG. 6A through FIG. 6H. As described above, the material of the pixel electrode 360 includes indium tin oxide (ITO), indium zinc oxide (IZO) or other transparent conductive material.

FIG. 4A is a top view of the etching stop layer according to an embodiment of the present invention; and FIG. 4B is a top view of the etching stop layer according to another embodiment of the present invention. Referring to FIG. 4A, in accordance with one embodiment of the present invention, the etching stop layer 350 includes a plurality of stripe patterns 350a having openings 352, each stripe pattern 350a is located above one of the scan lines 320 correspondingly. Referring to FIG. 4A, in accordance with another embodiment of the present invention, the etching stop layer 350 includes a plurality of frame patterns 350b; each frame pattern 350b is located under one of the pixel electrodes 360 correspondingly.

Figure 5:
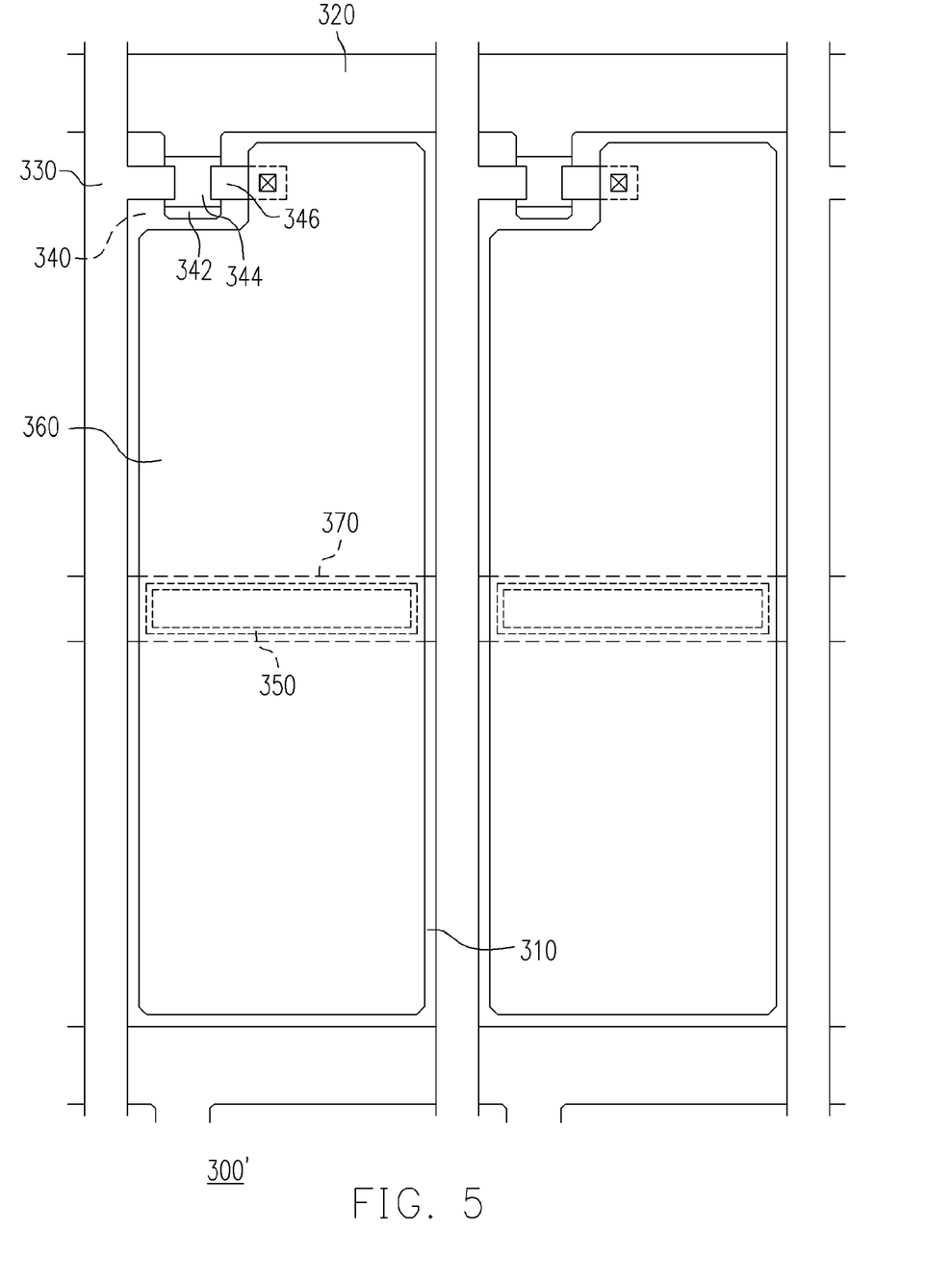
FIG. 5 is a cross-sectional view of the thin film transistor array according to another embodiment of the present invention.

FIG. 5 is a cross-sectional view of the thin film transistor array according to another embodiment of the present invention. Referring FIG. 5, the thin film transistor array 300' of the present invention includes a substrate 310, a plurality of scan lines 320, a plurality of data lines 330, a plurality of thin film transistor 340, a plurality of common lines 370, an etching stop layer 350 and a plurality of pixel electrodes 360. Since the thin film transistor array 300' are similar to the thin film transistor array 300 shown in FIG. 3, only difference between the thin film transistor array 300' and the thin film transistor array 300 is described.

Referring to FIG. 6, the common line 370 is disposed between two adjacent scan lines 320. It should be noted that the common line 370 and the scan lines 320 could be formed simultaneously. Since the storage capacitor of the thin film transistor array 300' is formed over the common lines 370, the etching stop layer 350 is disposed above the common lines 370. Similarly, the etching stop layer 350 described in this embodiment has a plurality of openings 352, so that a portion of each pixel electrode 360 is coupled to one of the common lines 370 through one of the openings 352 to form a storage capacitor. The cross-sectional view the storage capacitor is shown in FIG. 6A through FIG. 6H.

Figure 6A:
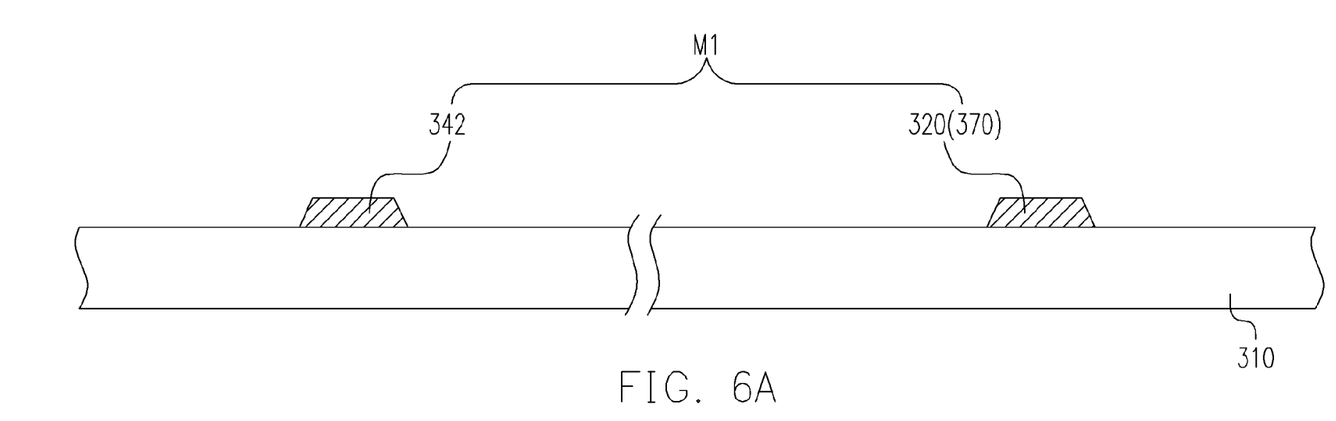
FIG. 6A through FIG. 6H is the fabricating process of the thin film transistor array according to one embodiment of the present invention.

FIG. 6A through FIG. 6H is the fabricating process of the thin film transistor array according to one embodiment of the present invention. Referring to FIG. 6A, first, a first patterned conductive layer M1 is formed over the substrate 310, and the first patterned conductive layer M1 includes aluminum (Al) or other conductive material.

When fabricating the thin film transistor array 300 (shown in FIG. 3) having a Cst on gate structure, the first patterned conductive layer M1 is formed by forming a first conductive material layer (not shown) over the substrate 310, and then the first conductive material layer is patterned to form a plurality of scan lines 320 and a plurality of gates 342, which are electrically connected with the scan lines 320 correspondingly.

When fabricating the thin film transistor array 300' (shown in FIG. 5) having a Cst on common structure, the first patterned conductive layer M1 is formed by forming a first conductive material layer (not shown) over the substrate 310, and then the first conductive material layer is patterned to form a plurality of scan lines 320, and a plurality of gates 342 connected with the scan lines 320, and a plurality of common lines 370 located between two adjacent scan lines 320.

Figure 6B:
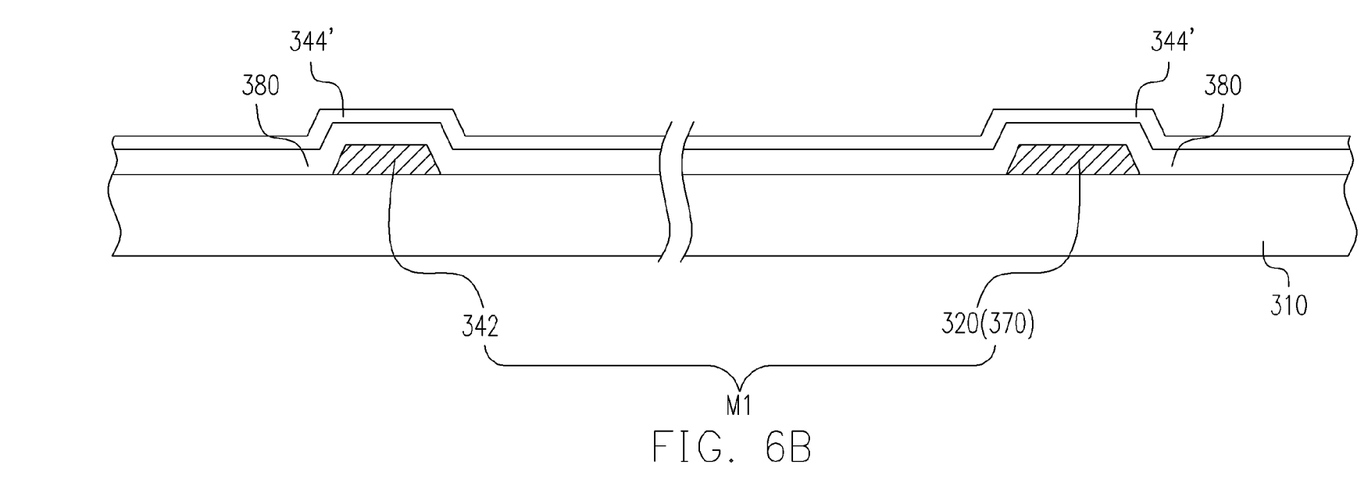

Then, referring to FIG. 6B, a gate insulator 380 and a semiconductor material layer 344' is formed over the substrate 310 and the first patterned conductive layer M1 sequentially. Wherein the gate insulator 380 includes silicon oxide, silicon nitride or other dielectric material, and the semiconductor material layer 344' includes amorphous silicon, for example.

Figure 6C:
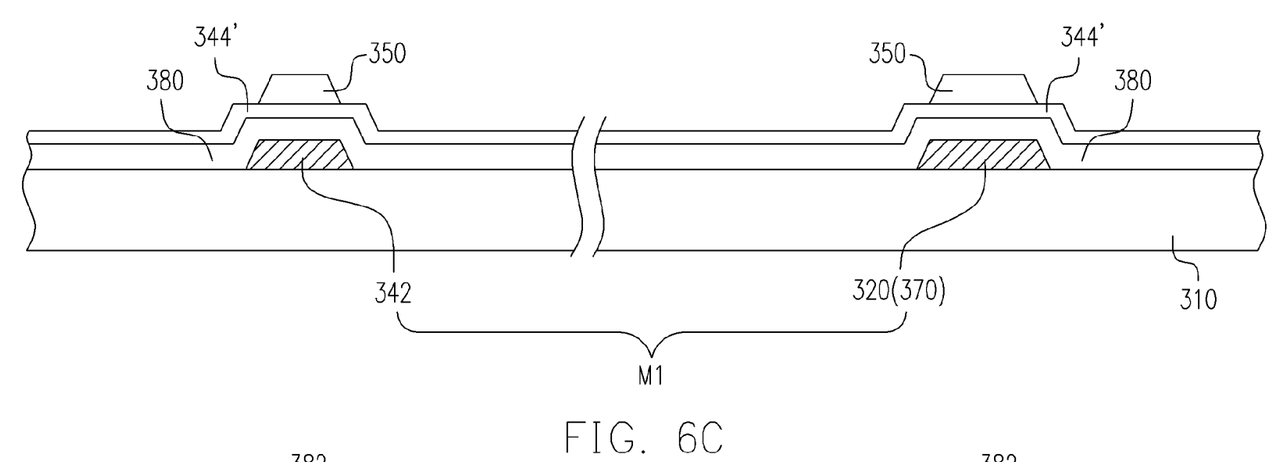

Referring to FIG. 6C, an etching stop layer 350 located above the first patterned conductive layer M1 is formed over a portion of the semiconductor material layer 344'. It should be noted that the etching stop layer 350 is formed above the gates 342 and the scan lines 320, when fabricating the thin film transistor array 300 (shown in FIG. 3) having a Cst on gate structure. Furthermore, the etching stop layer 350 is formed above the gates 342 and the common lines 370, when fabricating the thin film transistor array 300' (shown in FIG. 5) having a Cst on common structure.

Figure 6D:
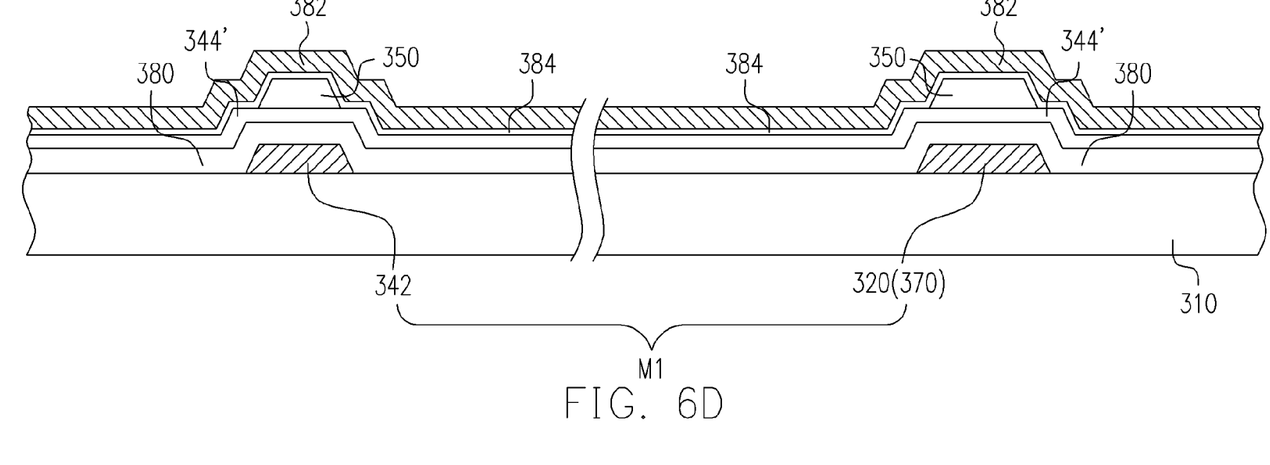

Referring to FIG. 6D, a second conductive material layer 382 is formed over the semiconductor material layer 344' and the etching stop layer 350. The second conductive material layer 382 is, for example, an aluminum/molybdenum/aluminum (Al/Mo/Al) stacked layer, a single metal layer or a composite metal layer. In order to enhance the performance of the devices, an ohmic contact layer 384 could be formed over the semiconductor material layer 344' and the etching stop layer 350 before forming the second conductive material layer 382. Therefore, the adhesion between second conductive material layer 382 and the semiconductor material layer 344' could be enhanced. As described above, the ohmic contact layer 384 is, for example, an n-type doped amorphous silicon.

Figure 6E:
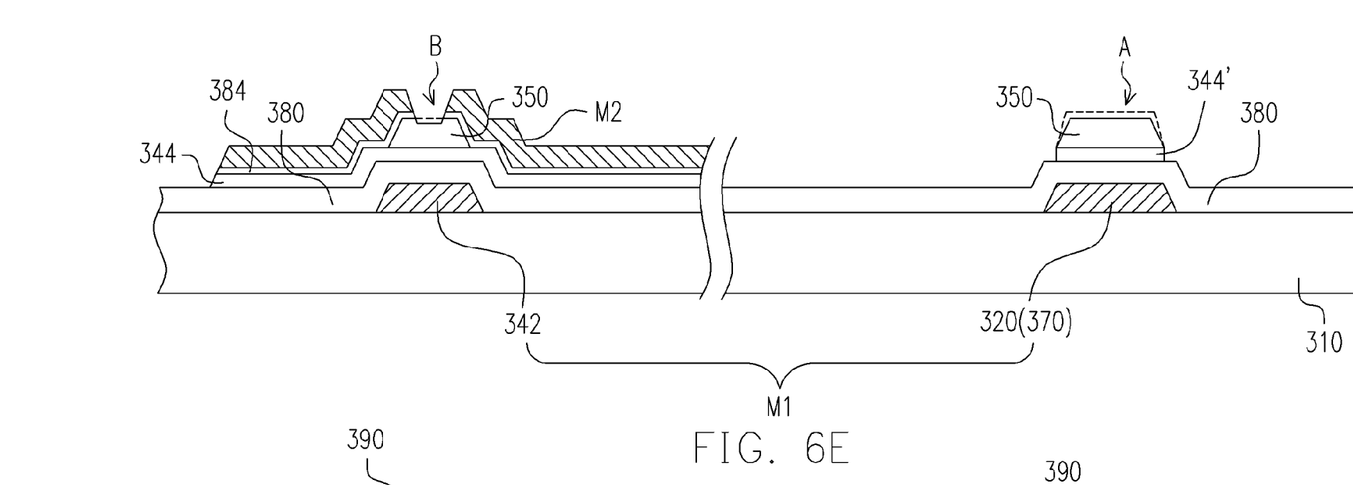

Referring to FIG. 6E, the second conductive material layer 382, the ohmic contact layer 384 and the semiconductor material layer 344' are patterned to simultaneously form a second patterned conductive layer M2 and a plurality of semiconductor layers 344, which are located under the etching stop layer 350 and the second patterned conductive layer M2. After the patterning process, the ohmic contact layer 384 is only located under the second patterned conductive layer M2. In other words, the pattern of the ohmic contact layer 384 and the second patterned conductive layer M2 are the same.

Referring to FIG. 6E, partial thickness of the etching stop layer 350 is removed, by using the second patterned conductive layer M2 as a mask during patterning the second conductive material layer M2 and the semiconductor material layer 344'. Wherein the profile of the etching stop layer 350 before etching is shown as A and B of FIG. 6E.

Figure 6F:
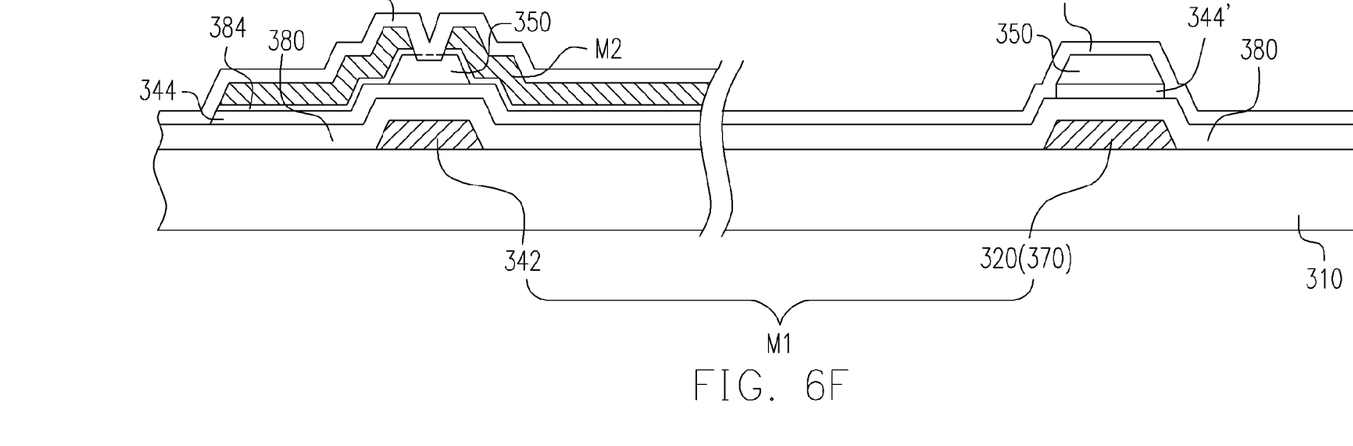
Figure 6G:
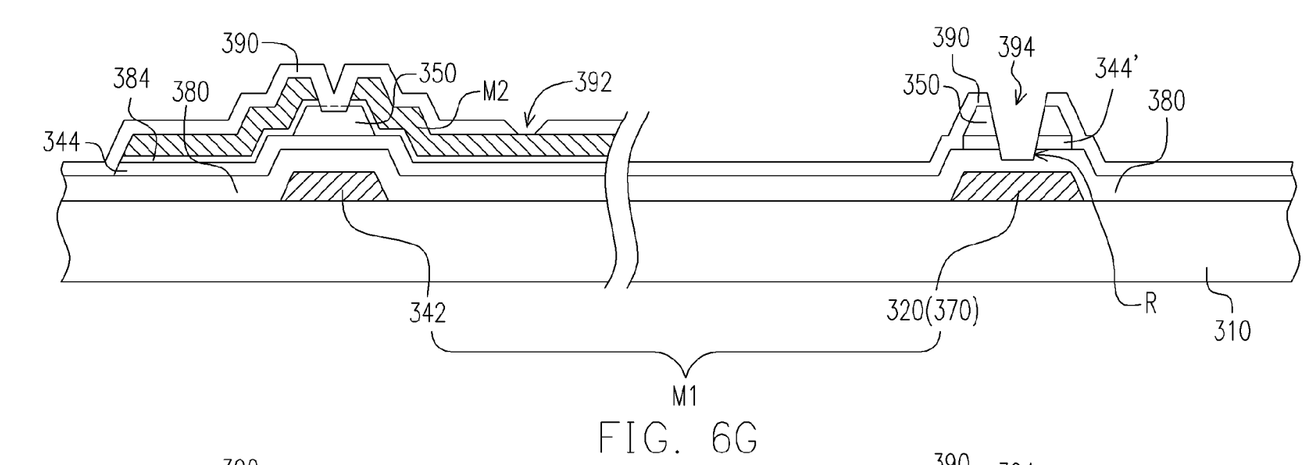

Referring to FIG. 6F and FIG. 6G, a passivation layer 390 is formed over the substrate 310, and then a portion of the passivation layer 390, which is located on the second patterned conductive layer M2, is removed to form a plurality of contact windows 392. At the same time, a portion of the passivation layer 390, the etching stop layer 350 and the semiconductor layers 344, which are located above the first patterned conductive layer M1, are removed simultaneously to form a plurality of openings 394. In this embodiment, the contact windows 392 and the openings 394 are, for example, formed by performing a photolithography/etch process. After performing the photolithography/etch process, a portion of the second patterned conductive layer M2 is exposed by the contact windows 392, and a portion of the gate insulator 380 is exposed by the openings 394. Furthermore, partial thickness of the gate insulator 380 may be removed to form a plurality of recesses R, which are located under the openings, when forming the contact windows 392. Instead of openings, the recesses R is formed in the gate insulator 380 because of the etching stop layer 350.

Figure 6H:
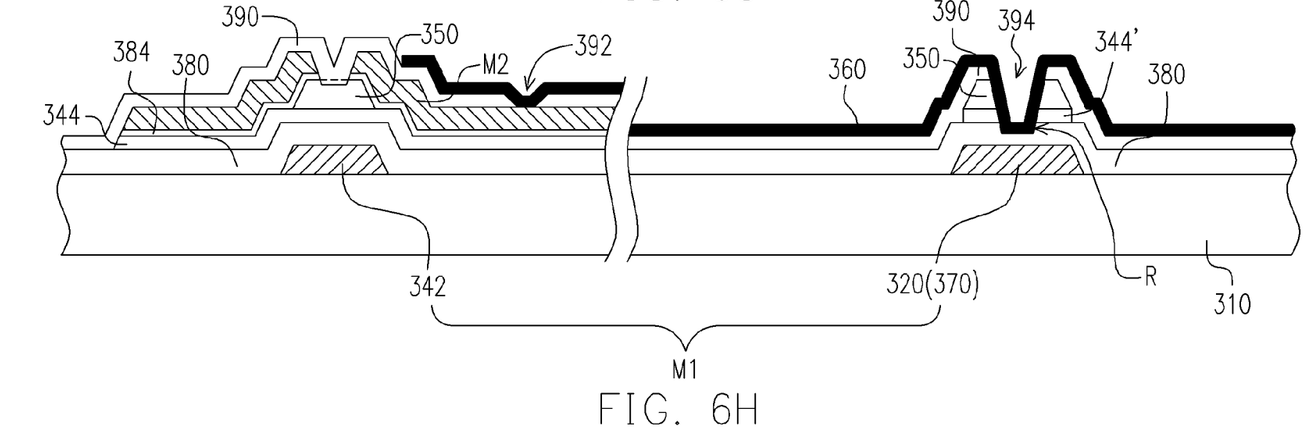

Referring to FIG. 6H, ultimately, a plurality of pixel electrodes 360 is formed over the substrate 310. Wherein each pixel electrode 360 is electrically connected to the second patterned conductive layer M2 through one of the contact windows 392, and a portion of each pixel electrode 360 is coupled to the first patterned conductive layer M1 through one of the openings 394 to form a storage capacitor. It should be noted that the recesses R formed on a surface of the gate insulator 380 reduce the thickness thereof; therefore the capacitance of the storage capacitor can be increased.

As described above, the present invention at least provides the following advantages:

1. In the thin film transistor array of the present invention, the capacitance of the storage capacitor and aperture ratio thereof is increased.

2. The fabricating method of the thin film transistor array is compatible with current processes. More specifically, the capacitance of the storage capacitor is significantly increased without modifying processes substantially.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

The invention claimed is:

1. A thin film transistor array, comprising:
a substrate;
a plurality of scan lines disposed over the substrate;
a plurality of data lines disposed over the substrate, wherein the substrate is defined into a plurality of pixel areas by the scan lines and the data lines;
a plurality of thin film transistors driver by the scan lines and the data lines, wherein each thin film transistor is disposed in one of the pixel areas correspondingly;
an etching stop layer disposed over the scan lines, wherein the etching stop layer has a plurality of openings; and
a plurality of pixel electrodes, each pixel electrode is disposed in one of the pixel areas and is electrically connected to one of the thin film transistors correspondingly, wherein a portion of each pixel electrode is coupled to one of the scan lines through one of the openings to form a storage capacitor.

2. The thin film transistor array of claim 1, further comprising a gate insulator disposed between the etching stop layer and the scan lines.

3. The thin film transistor array of claim 2, wherein the gate insulator has a plurality of recesses, and each recess is located under one of the openings of the etching stop layer.

4. The thin film transistor array of claim 2, further comprising a semiconductor layer disposed between the etching stop layer and the gate insulator.

5. The thin film transistor array of claim 2, further comprising a passivation layer disposed over the etching stop layer and the gate insulator, wherein the openings of the etching stop layer is exposed by the passivation layer.

6. The thin film transistor array of claim 1, wherein the etching stop layer comprises a plurality of stripe patterns, each stripe pattern is located above one of the scan lines correspondingly.

7. The thin film transistor array of claim 1, wherein the etching stop layer comprises a plurality of frame patterns, each frame pattern is located under one of the pixel electrodes correspondingly.

8. The thin film transistor array of claim 1, wherein a material of the pixel electrodes comprises ITO or IZO.

9. A thin film transistor array, comprising:
a substrate;
a plurality of scan lines disposed over the substrate;
a plurality of data lines disposed over the substrate, wherein the substrate is defined into a plurality of pixel areas by the scan lines and the data lines;
a plurality of thin film transistors driven by the scan lines and the data lines, wherein each thin film transistor is disposed in one of the pixel areas correspondingly;
a plurality of common lines disposed over the substrate, wherein each common line is located between two adjacent scan lines;
an etching stop layer disposed over the common lines, wherein the etching stop layer has a plurality of openings; and
a plurality of pixel electrodes, each pixel electrode is disposed in one of the pixel areas and is electrically connected to one of the thin film transistors correspondingly, wherein a portion of each pixel electrode is coupled to one of the scan lines through one of the openings to form a storage capacitor.

10. The thin film transistor array of claim 9, further comprising a gate insulator disposed between the etching stop layer and the common lines.

11. The thin film transistor array of claim 10, wherein the gate insulator has a plurality of recesses, and each recess is located under one of the openings of the etching stop layer.

12. The thin film transistor array of claim 10, further comprising a semiconductor layer disposed between the etching stop layer and the gate insulator.

13. The thin film transistor array of claim 10, further comprising a passivation layer disposed over the etching stop layer and the gate insulator, wherein the openings of the etching stop layer is exposed by the passivation layer.

14. The thin film transistor array of claim 9, wherein the etching stop layer comprises a plurality of stripe patterns, each stripe pattern is located above one of the common lines correspondingly.

15. The thin film transistor array of claim 9, wherein the etching stop layer comprises a plurality of frame patterns, each frame pattern is located under one of the pixel electrodes correspondingly.

16. The thin film transistor array of claim 9, wherein a material of the pixel electrodes comprises ITO or IZO.

* * * * *